US007904841B1

(12) United States Patent
Dixon, III et al.

(10) Patent No.: US 7,904,841 B1
(45) Date of Patent: Mar. 8, 2011

(54) METHOD AND SYSTEM FOR OPTIMIZING DIGITAL FILTERS

(75) Inventors: Walter Vincent Dixon, III, Delanson, NY (US); Mark Richard Gilder, Clifton Park, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 557 days.

(21) Appl. No.: 11/871,955

(22) Filed: Oct. 12, 2007

(51) Int. Cl.
*G06F 17/50* (2006.01)

(52) U.S. Cl. ........ 716/3; 716/1; 716/2; 716/18; 708/300; 708/314; 708/819; 708/820; 708/821; 375/225; 375/226; 375/227; 375/228; 375/240

(58) Field of Classification Search .............. 716/1–3, 716/6, 18; 708/300, 314, 819–821; 375/225–228, 375/240

See application file for complete search history.

(56) References Cited

U.S. PATENT DOCUMENTS

| | | | |
|---|---|---|---|
| 6,662,200 B2 | 12/2003 | Acharya | |
| 6,725,247 B2 | 4/2004 | Acharya | |
| 6,757,326 B1 * | 6/2004 | Prieto et al. | 375/232 |
| 6,766,286 B2 | 7/2004 | Acharya | |
| 7,257,609 B1 * | 8/2007 | Kosunen et al. | 708/493 |
| 7,313,186 B2 * | 12/2007 | Prieto et al. | 375/240.19 |
| 2002/0161807 A1 | 10/2002 | Acharya | |
| 2002/0174154 A1 | 11/2002 | Acharya | |
| 2002/0184276 A1 | 12/2002 | Acharya | |
| 2004/0158494 A1 | 8/2004 | Acharya | |
| 2006/0218213 A1 * | 9/2006 | Shehata et al. | 708/300 |

OTHER PUBLICATIONS

Neau et al., Low complexity FIR filter using Factorization of Perturbed Coefficient, 2001, IEEE, pp. 268-272.*
Yurdaduk, Multiplierless Implemenation of 2-D FIR filter, Integration, the VLSI Journal 38, 2005, p. 597-613.*

* cited by examiner

*Primary Examiner* — Nghia M Doan
(74) *Attorney, Agent, or Firm* — McDermott Will & Emery LLP

(57) ABSTRACT

A method and system is described for optimizing a digital filter defined by coefficients that are multiplied by input data and accumulated to generate output data. A factorization set of candidate factors is compiled based on the coefficients. For each of the candidate factors, an optimized solution is generated. To generate the optimized solution, the candidate factor is applied to the coefficients and a working set of terms is compiled. Terms in the working set are converted to power-of-two representations and grouped with other terms that have a common partial sum, or multiple of the partial sum, within their respective power-of-two representations. A reduction set is compiled from the grouped terms and an order of application is selected based on optimization objectives. The reduction set is then applied to the working set of terms to generate the optimized solution, which is ranked and stored based on the optimization objectives.

21 Claims, 7 Drawing Sheets

METHOD AND SYSTEM FOR OPTIMIZING DIGITAL FILTERS

STATEMENT REGARDING FEDERALLY SPONSORED RESEARCH OR DEVELOPMENT

Not applicable.

BACKGROUND OF THE INVENTION

The invention concerns digital filters used in digital signal processing (DSP) applications and, in particular, is directed to a method for optimizing digital filters such as finite impulse response (FIR) filters and convolution filters.

FIR filters and convolution filters are defined by a fixed set of coefficients that are multiplied by input data and accumulated to compute an overall result. For example, a FIR filter can be represented by the following equation:

$$y(n) = \sum_{i=0}^{n} c_i * x_i \quad (1)$$

where $c_i$ represents the filter coefficients. As the number of coefficients increases, the computational resources required to implement the filter correspondingly increase.

Digital filters are often implemented directly in hardware. The multipliers and adders needed to implement digital filters increase the computational complexity of a system and consume valuable chip resources. In most applications it is desirable to minimize the hardware resources required to satisfy a system specification. Accordingly, a continuing need exists to develop techniques for optimizing the structure of digital filters so as to minimize the resources needed to implement the filters.

BRIEF SUMMARY OF THE INVENTION

The invention addresses the foregoing needs in digital filter design by introducing a new method for optimizing a digital filter such as a FIR filter or a convolution filter. The invention takes advantage of the ability to represent a term with a summation of power-of-two factors to replace multipliers in an implementation of a digital filter with adders and registers. User configurable optimization objectives are used to select and evaluate possible solutions through multiple iterations of the optimization process of the invention. By selecting different optimization objectives different design priorities can be set when optimizing a digital filter.

According to one aspect of the invention, a method and system is provided for optimizing a digital filter defined by coefficients that are multiplied by input data and accumulated to generate output data. A factorization set of candidate factors is compiled based on the coefficients. For each of the candidate factors, an optimized solution is generated. To generate the optimized solution, the candidate factor is applied to the coefficients and a working set of terms is compiled. Terms in the working set are converted to power-of-two representations and grouped with other terms that have a common partial sum, or multiple of the partial sum, within their respective power-of-two representations. A reduction set is compiled from the grouped terms and an order of application is selected based on optimization objectives. The reduction set is then applied to the working set of terms to generate the optimized solution, which is ranked and stored based on the optimization objectives.

According to another aspect of the invention, a computer-readable medium is provided containing computer-executable instructions for performing a method for optimizing a digital filter defined by coefficients that are multiplied by input data and accumulated to generate output data. A factorization set of candidate factors is compiled based on the coefficients. For each of the candidate factors, an optimized solution is generated. To generate the optimized solution, the candidate factor is applied to the coefficients and a working set of terms is compiled. Terms in the working set are converted to power-of-two representations and grouped with other terms that have a common partial sum, or multiple of the partial sum, within their respective power-of-two representations. A reduction set is compiled from the grouped terms and an order of application is selected based on optimization objectives. The reduction set is then applied to the working set of terms to generate the optimized solution, which is ranked and stored based on the optimization objectives.

According to yet another aspect of the invention, a system for optimizing a digital filter defined by a plurality of coefficients that are multiplied by input data and accumulated to generate output data is provided. The system includes a memory and a processor configured to execute an optimization method. A factorization set of candidate factors is compiled based on the coefficients. For each of the candidate factors, an optimized solution is generated. To generate the optimized solution, the candidate factor is applied to the coefficients and a working set of terms is compiled. Terms in the working set are converted to power-of-two representations and grouped with other terms that have a common partial sum, or multiple of the partial sum, within their respective power-of-two representations. A reduction set is compiled from the grouped terms and an order of application is selected based on optimization objectives. The reduction set is then applied to the working set of terms to generate the optimized solution, which is ranked and stored based on the optimization objectives.

The foregoing summary of the invention has been provided so that the nature of the invention can be understood quickly. A more detailed and complete understanding of the preferred embodiments of the invention can be obtained by reference to the following detailed description of the invention together with the associated drawings.

DETAILED DESCRIPTION OF THE INVENTION

The detailed description of the invention set forth below in connection with the associated drawings is intended as a description of various embodiments of the invention and is not intended to represent the only embodiments in which the invention may be practiced. The detailed description includes specific details for the purpose of providing a thorough understanding of the invention. However, it will be apparent to those skilled in the art that the invention may be practiced without all of the specific details contained herein. In some instances, well known structures and components are shown in block diagram form in order to avoid obscuring the concepts of the invention.

The invention comprises a method and system for optimizing a digital filter using an technique that removes multipliers from the filter configuration and identifies portions of the filter configuration where the number of adders can be reduced. As will be described below, the invention provides flexibility for a user to identify specific optimization objectives against which solution sets can be compared and evaluated to identify optimizations that best meet a particular application's requirements.

Figure 1:
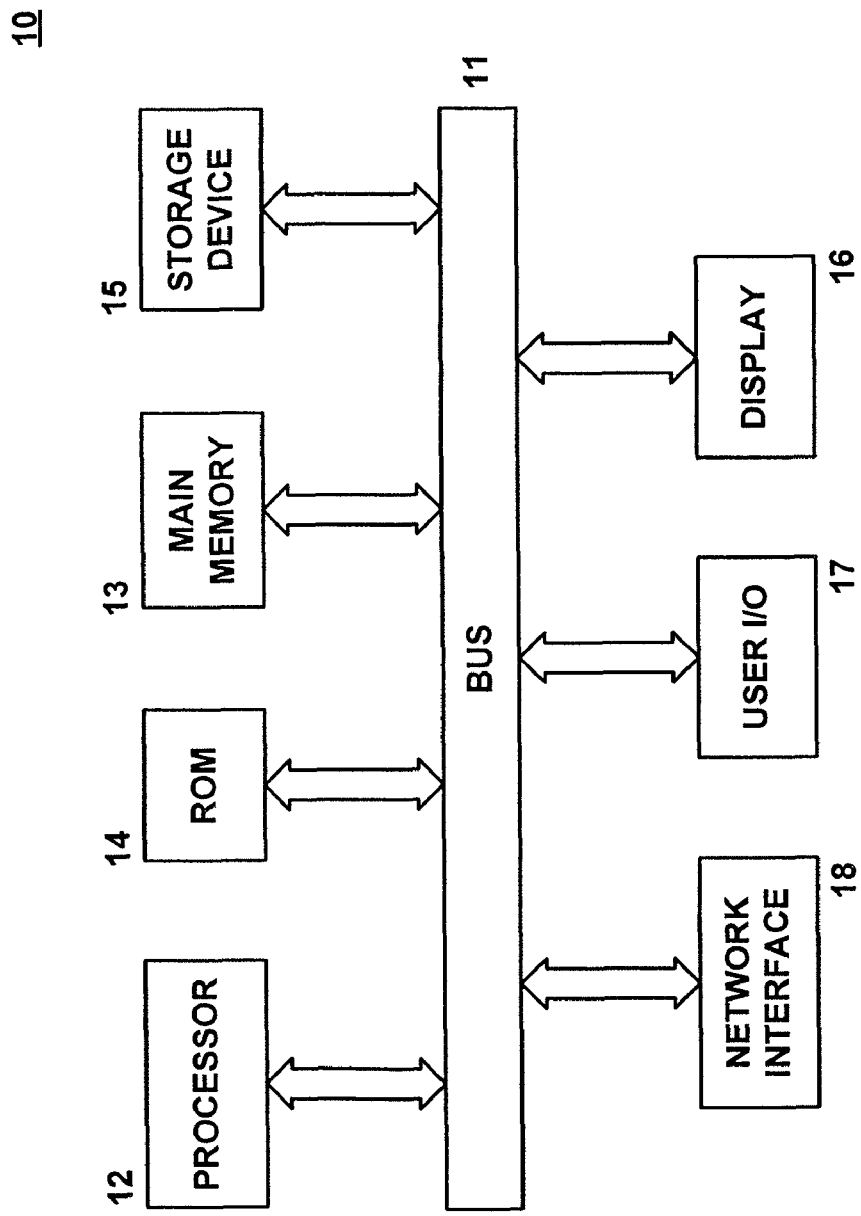
FIG. 1 is a block diagram depicting components of a computer system according to one embodiment of the invention.

FIG. 1 is a block diagram that illustrates a computer system 10 in which an embodiment of the invention may be implemented. Computer system 10 includes a bus 11 or other communication mechanism for communicating information, and a processor 12 coupled with bus 11 for processing information. Computer system 10 also includes a main memory 13, such as a random access memory (RAM) or other dynamic storage device, coupled to bus 11 for storing information and instructions to be executed by processor 12. Main memory 13 also may be used for storing temporary variables or other intermediate information during the execution of instructions by processor 12. Computer system 10 further includes a read only memory (ROM) 14 or other static storage device coupled to bus 11 for storing static information and instructions for processor 12. A storage device 15, such as a magnetic disk or an optical disk, is provided and coupled to bus 11 for storing information and instructions.

Computer system 10 may be coupled via bus 11 to a display 16, such as a liquid crystal display (LCD) or a cathode ray tube (CRT), for displaying information to a computer user. A user I/O device 17 for communication information and command selections to processor 12 also may be coupled to bus 11. User I/O device 17 includes a keyboard containing alphanumeric and other keys as well as a cursor control device such as a mouse, a trackball, or cursor direction keys for communicating direction information and command selections to processor 12 and for controlling cursor movement on display 16.

The invention is related to the use of computer system 10 for optimizing an implementation of a digital filter. According to one embodiment of the invention, an optimized digital filter arrangement is provided by computer system 10 in response to processor 12 executing one or more sequences of one or more instructions contained in main memory 13. Such instructions may be read into main memory 13 from another computer-readable medium, such as storage device 15. Execution of the sequences of instructions contained in main memory 13 causes processor 12 to perform the process steps described in more detail below. One or more processors in a multi-processing arrangement may also be employed to execute the sequences of instructions contained in main memory 13. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 12 for execution. Such a medium may take many forms, including, but not limited to, non-volatile media, volatile media, and transmission media. Non-volatile media include, for example, optical or magnetic disks, such as storage device 15. Volatile media include dynamic memory, such as main memory 13. Transmission media include coaxial cables, copper wire, and fiber optics, including the wires that comprise bus 11. Transmission media can also take the form of acoustic or light waves, such as those generated during radio frequency (RF) and infrared (IR) data communications. Common forms of computer-readable media include, for example, a floppy disk, a flexible disk, a hard disk, magnetic tapes or any other magnetic medium, a CD-ROM, DVD-ROM, and any other optical medium. Computer-readable media also includes other forms of memory such as PROM, EEPROM, FLASH memory, and other memory chip or cartridge formats. In summary, a computer-readable media represents any medium from which a computer can read data and instructions.

Various forms of computer-readable media may be involved in carrying one or more sequences of one or more instructions to processor 12 for execution. For example, the instructions may initially be borne on a magnetic disk on a remote computer. The remote computer can load the instructions into its dynamic memory and send the instructions to computer system 10 via a network or over a telephone line. Computer system 10 receives the instructions at network interface 18 coupled to bus 11. After being placed on bus 11 by network interface 18, bus 11 carries the data to main memory 13, from which processor 12 retrieves and executes the instructions. The instructions received by main memory 13 may optionally be stored on storage device 15 either before or after execution by processor 12.

As noted above, computer system 10 also includes a network interface 18 coupled to bus 11. Network interface 18 provides a two-way data communication coupling to a network. Network interface 18 may be a local area network (LAN) card to provide a data communication connection to a compatible LAN. Wireless links may also be implemented. In any such implementation, network interface 18 sends and receives electrical, electromagnetic or optical signals that carry digital data streams representing various types of information. Network interface 18 also may provide two-way data communication with wide area networks (WAN) and the Internet.

A description of the operation of the invention will now be provided with reference to the flowcharts depicted in FIG. 2 to FIG. 5. The flowcharts represent one or more instruction sequences executed by a computer system in the manner described above. The invention is not limited to the use of any particular programming language for generating the one or more instructions sequences. For example, the one or more instruction sequences may be generated using Java, C, Perl, etc. Those of ordinary skill in the art will understand how to apply the process steps described below to the various programming languages.

Figure 2:
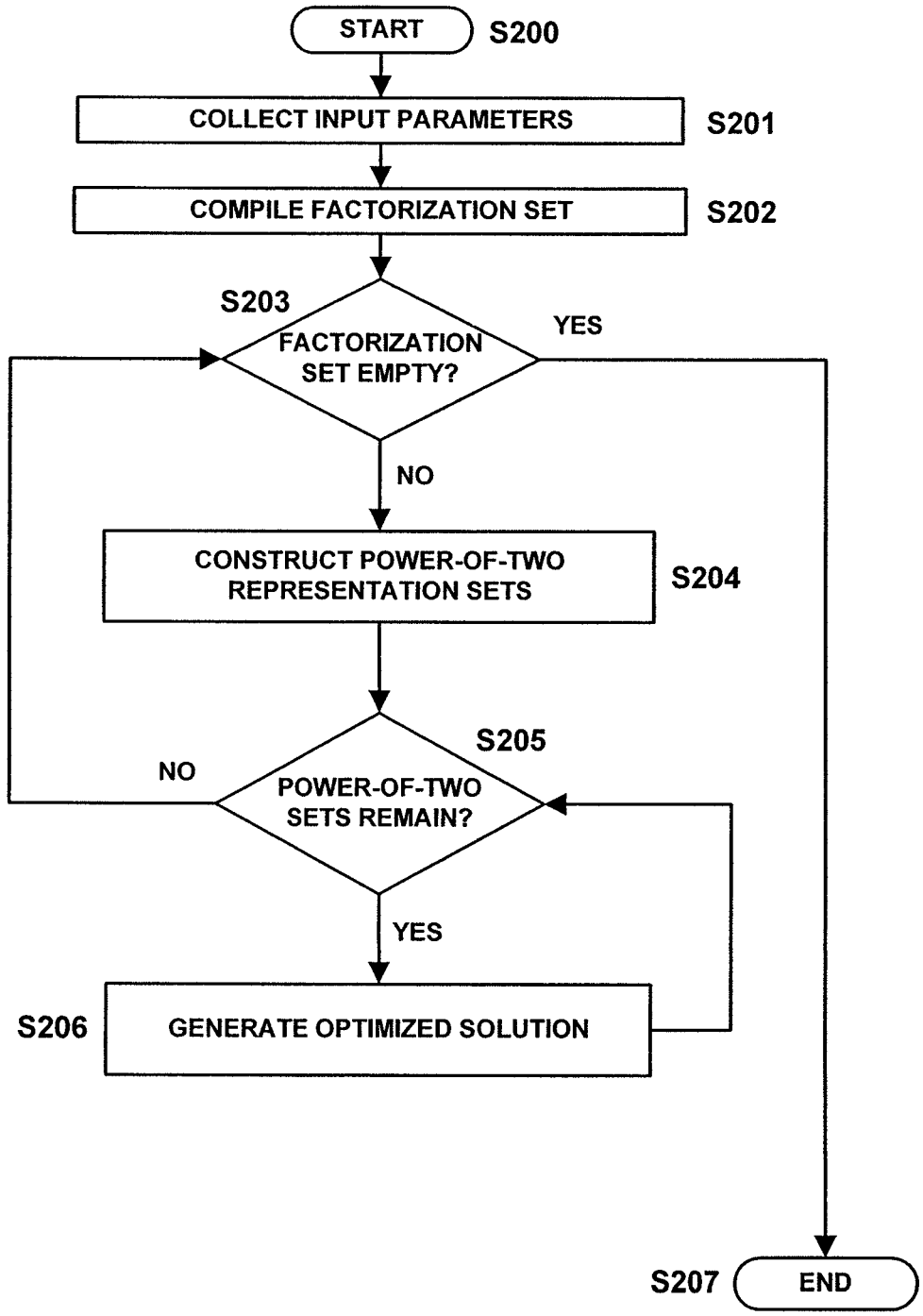
FIG. 2 is a flowchart depicting an optimization process according to one embodiment of the invention.
Figure 3:
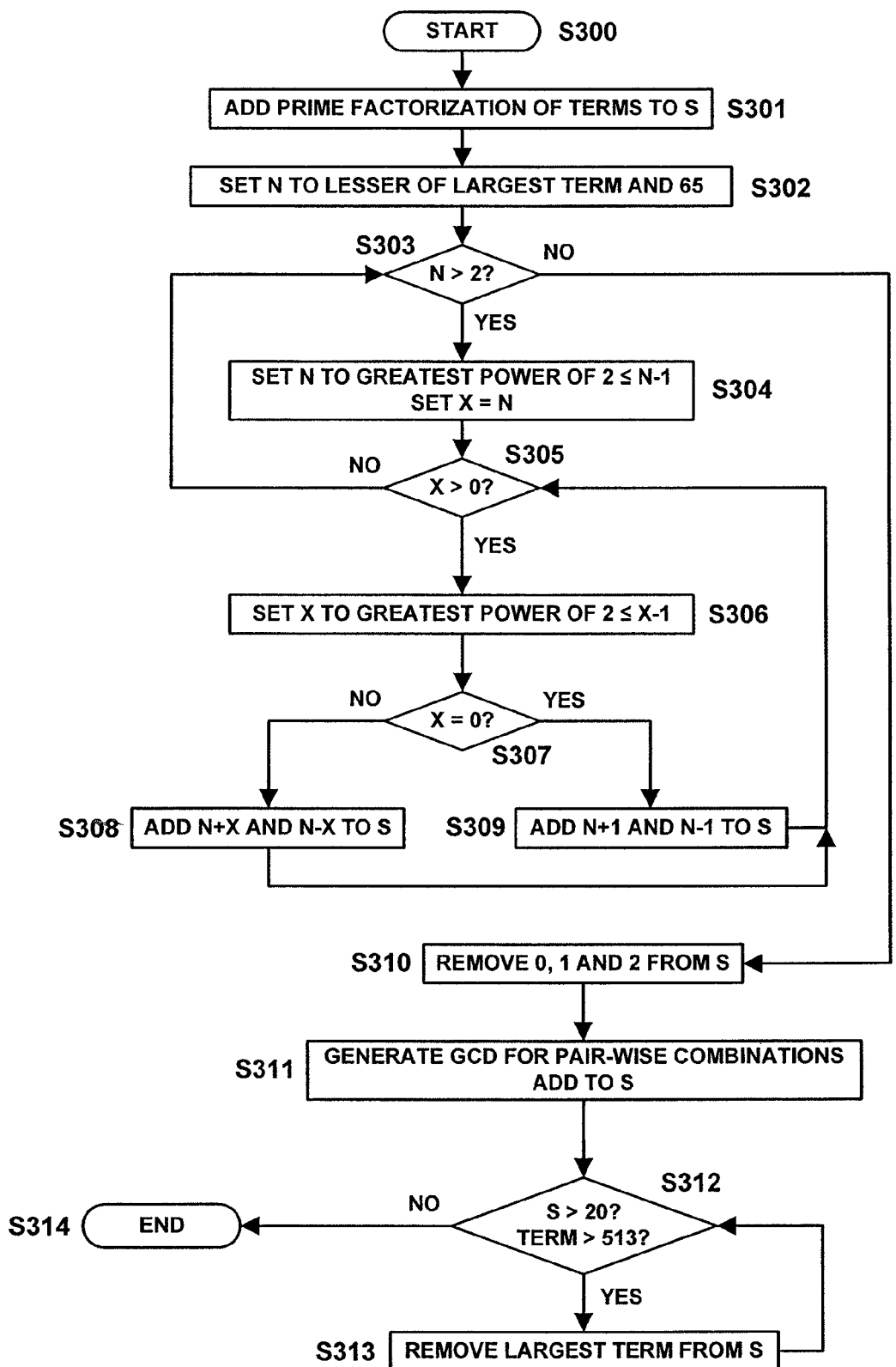
FIG. 3 is a flowchart depicting a factorization set compilation process according to one embodiment of the invention.

Turning to FIG. 2, a flowchart depicting a process for optimizing a digital filter according to one embodiment of the invention is depicted. Briefly, the process depicted in FIG. 2 includes collecting input parameters (step S201), compiling a factorization set (step S202), constructing power-of-two representations sets (step S204), and generating optimized solutions (step S206). Each of these steps will be described in more detail below.

The optimization process represented in FIG. 2 is initiated in step S200 by loading the relevant instruction sequence(s) for execution in a computer system such as the one depicted in FIG. 1. The initiation may be the result of a user selecting an application stored in the computing system via a graphical user interface (GUI) or a user loading the instruction sequence(s) onto the computer via a network or removable storage device.

Upon initiation, the user inputs parameters in step S201 for use in the optimization process. According to one embodiment, the user is presented with a GUI for inputting the parameters. This GUI may launch automatically with the initiation of the optimization process or, alternatively, the user may be required select an option for launching the GUI. It is to be understood that the invention is not limited to the use of GUIs for inputting and displaying data within the computer system. Other mechanisms, including simple text, may be used in alternative embodiments of the invention. The mechanisms will vary depending on the computer system and its associated operating system.

Among the parameters entered by the user is the digital filter equation. For purposes of this description an FIR filter will be used to describe various embodiments of the invention. As mentioned above, a FIR filter is defined by a fixed set of coefficients that are multiplied by an input data stream. The user may enter the FIR filter equation into the computer system or, alternatively, the user may select a FIR filter equation from one or more filter equations already stored on the computer system. For purposes of this description, the following FIR filter equation will be used to describe the optimization process:

$$F=170t[0]+42t[1]+941t[2] \qquad (2)$$

While this equation only includes three coefficients, one of ordinary skill in the art will recognize that the scope of the invention is not limited to a FIR filter having only three coefficients. The principles of the invention may be applied to FIR filters having more than three coefficients as well as to those having less than three coefficients.

In addition to the filter equation, the input parameters include optimization objectives selected or input by the user based on the user's desired optimization. The implementation of a digital filter in hardware typically includes features such as adders, registers, multipliers, etc. that are arranged to implement the filter equation defining the digital filter. The optimization objectives include specific features of the digital filter implementation that are selected for optimization. The optimization objectives include, but are not limited to, minimize sum (weighted adders+weighted registers), minimize adder count, minimize register depth, minimize tree depth, and minimize data path. The optimization objectives further include heuristic parameters which include, but are not limited to, adder weight, register weight, inner loop threshold before limiting applied, maximum inner loop iterations, maximum permutation index and enable registering. Additionally, the optimization objectives may include maximizing parallelism and pipelineability in the optimized implementation of the digital filter. In accordance with the optimization objectives, the optimization process is executed and an optimized solution is generated for minimizing the implementation costs of the digital filter.

In step S202, a factorization set of candidate factors is compiled for use in the optimization process. The compilation of the factorization set (S) is represented in the flowchart depicted in FIG. 3. The compilation process begins in step S300 with an empty factorization set S. In step S301, all prime factors for each coefficient in the filter equation are added to S. For example, the following prime factors are added to S for the filter equation (2) provided above: 3, 5, 7, 17 and 941.

Once the prime factors have been added to factorization set S, a pair of loops are engaged to populate factorization set S with additional candidate factors. The outer loop is initiated in step S302 by setting a variable N to equal the lesser of the largest term in the filter equation and 65. Since the largest term in the filter equation (2) is 941, N is set to 65 in the present example. As indicated in step S303, the outer loop is repeated until the variable N is no longer greater than 2.

The inner loop is initiated in step S304 by setting the variable N to the greatest power of 2 less than or equal to current value of N−1 and setting a variable X to the new value of N. In the current example, 64 is the largest power of 2 less than or equal to N−1 (65−1=64), and therefore the variables N and X are both set to 64. As indicated in step S305, the inner loop is repeated until X is no longer greater than 0.

In step S306, the variable X is set to the greatest power of 2 less than or equal to the current value of X−1. In the first iteration of the current example, X is set to 32. In step S307, it is determined whether X is equal to 0. If X does not equal to 0, terms N+X (64+32=96) and N−X (64−32=32) are added to the factorization set S in step S308. If X does equal 0, terms N+1 (64+1=65) and N−1 (64−1=63) are added to the factorization set S in step S309. Processing then returns to step S305 to determine if X is greater than 0.

Once the inner loop completes processing (i.e., X>0), the process returns to step S303 to determine if N is greater than 2. If N is greater than 2, steps S304 to S309 are repeated as described above. If N is no longer greater than 2, processing proceeds to step S310 where the terms 0, 1 and 2 are removed from the factorization set. In step S311, the greatest common denominator for each pair-wise combination of the terms in the filter equation is determined. Referring to filter equation (2), the greatest common denominator is determined and added to S for the pairs 42/170, 42/941 and 170/941, which is 1 for all three cases.

The processing used to execute the optimization process may be reduced by limiting the number of factors in the factorization set S under certain conditions. For example, in step S312 it is determined if there are more than 20 factors currently in S and, if so, it is determined whether any factor is greater than 513. If both of these conditions are true, the largest factor is removed from the factorization set S in step S313 and processing returns to step S312 to determine if additional factors need to be removed. Steps S312 and S313 are repeated until either S contains 20 factors or there are no more factors greater than 513. It is to be understood that the invention is not limited to the threshold number of factors (20) and the factor value (513) used in step S312. One skilled in the art will recognize that the threshold number of factors may be increased beyond 20 or reduced below 20 without departing from the scope of the invention. Additionally, the threshold factor value may be increased above 513 or reduced below 513 without departing from the scope of the invention. A user may set these values to account for differences in computing resources, processing time available, etc.

Once the factorization set S has been populated, the process ends in step S314 by storing the factorization set S in the computer system for use by the optimization process. The process then proceeds to step S203 in FIG. 2. Based on the filter equation (2) above, the process represented in FIG. 3 compiles a factorization set S having the following terms: 96, 80, 72, 68, 66, 65, 63, 62, 60, 56, 48, 40, 36, 33, 32, 31, 30, 28, 24, 20, 18, 17, 16, 15, 14, 12, 10, 9, 8, 7, 6, 5, 4, 3, 1.

Returning to FIG. 2, a sequence of steps is executed for each candidate factor in the factorization set. To initiate the loop, it is determined in step S203 whether the factorization set S is empty. If factors remain in the factorization set S, processing proceeds to step S204. If no more factors remain, the optimization process ends at step S207.

Figure 4:
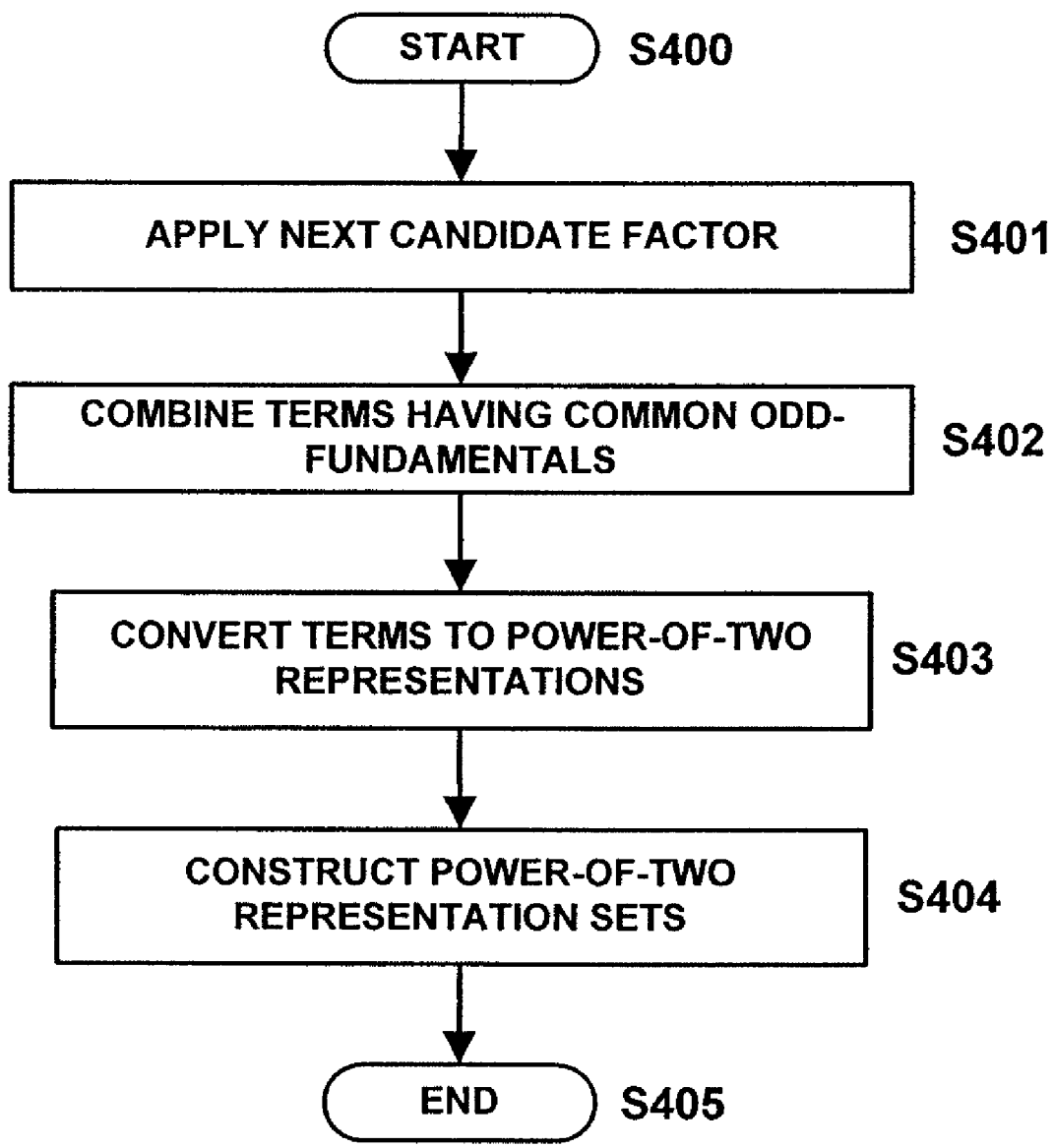
FIG. 4 is a flowchart depicting a power-of-two representation construction process according to one embodiment of the invention.

In step S204, power-of-two representation sets are constructed from a working set of terms. FIG. 4 includes a flowchart containing the process steps used to construct the power-of-two representation sets. Briefly, the process illustrated in FIG. 4 includes applying the next candidate factor to the coefficients of the digital filter to compile a working set of terms (step S401), combining terms having a common odd-fundamental (step S402), converting terms in the working set to power-of-two representations (step S403), and constructing the power-of-two representation sets (step S404). Each of these steps will be described in more detail below.

The process shown in FIG. 4 begins at step S400 when it is determined in step S203 that candidate factors remain in the factorization set S. In step S400, the next factor in the set S is selected for processing. According to one embodiment of the invention, the factors are selected and applied from the set S in ascending order. Accordingly, the unity factor (1) is selected first and applied from the sample factorization set S detailed above. Once selected and applied, the factor is removed from the factorization set S for future iterations of the optimization process.

In an alternative embodiment of the invention, the factors are selected in an order determined based on an estimated cost savings associated with each factor once the unit factor has been applied and removed from the factorization set S. For example, an N×M table may be constructed where N is the number of candidate factors and M is the number of filter coefficients. Each cell in the table is computed by $d(c_i/f_j)$ where $0<i\leq N$ and $0<j\leq M$. A table generated for three factors and three coefficients is shown below.

| $d(c_1/f_1)$ | $d(c_2/f_1)$ | $d(c_3/f_1)$ |
| $d(c_1/f_2)$ | $d(c_2/f_2)$ | $d(c_3/f_2)$ |
| $d(c_1/f_3)$ | $d(c_2/f_3)$ | $d(c_3/f_3)$ |

$d(c_i/f_j)$ is computed by taking the lowest power-of-two representation for both the quotient and the remainder of $c_i/f_j$ and adding the number of adders required for each representation together. The number of adders is computed again with the quotient adjusted by +1 or −1 depending on if the quotient is positive or negative, respectively. Each of these resulting number of adders is compared against the number of adders required for the original coefficient in its lowest power-of-two representation and the highest cost savings, in terms of the number of adders, is placed in the cell for $d(c_i/f_j)$. If there is no savings, the cell value is set to zero.

According to one embodiment of the invention, the next candidate factor to apply after the unit factor is selected based on the values in each of the table rows. For example, the next candidate factor to apply may be selected by adding up the cell values for each row and selecting the candidate factor corresponding to the row having the largest sum of values.

In step S401, the candidate factor is applied to the coefficients of the filter equation. A working set is compiled by dividing each of the coefficients by the current candidate factor and adding the result as a term in the working set. For example, dividing the coefficients from the filter equation (2) above by the unity factor, terms 42, 170 and 941 are added to the working set.

For non-unity candidate factors, the coefficients of the filter equation are divided by the candidate factor and the quotient and remainder are added as terms to the working set. According to one embodiment of the invention, only coefficients whose associated value in the table discussed above is non-zero are divided by the candidate factor. Coefficients whose associated value in the table above is zero are added to the working set without being divided by the candidate factor. When non-unity factors are applied during the compilation of working sets, terms compiled using the non-unity factor are applied to the optimization process described below to generate a solution. The remaining terms in the working set (i.e., those not divided by the non-unity factor) are applied to the optimization process in a separate iteration. The two optimized solutions are then combined with the solution derived from the quotients and remainders are multiplied by the non-unity factor to recover the original value prior to being divided.

In step S402, the current terms in the working set W are optionally examined to determine whether any of the terms share a common odd fundamental. In the current example, none of the terms 42, 170 and 941 in filter equation (2) share a common odd fundamental. Accordingly, none of the terms in the working set W are combined in step S402.

For purposes of explanation, the following example is provided to illustrate a situation in which terms in the working set W share an odd fundamental. Assuming the following filter equation has been input for optimization:

$$F=3t(0)+6t(1)+7t(2) \tag{3}$$

the terms 3, 6 and 7 are examined to determine if any pair share a common odd fundamental. The terms 3 and 6 share the odd fundamental term 3. Accordingly, in step S402 the terms 3 and 6 are combined and replaced with an intermediate term. Specifically, an intermediate term $n(0)=t(0)+2t(1)$ is implemented such that the working set W now includes the terms $3n(0)$ and $7t(2)$.

Returning to the example based on the filter equation (2), the terms in the working set are converted to power-of-two representations in step S403. The invention utilizes the fact that integer multiplication by a constant value can be implemented as a summation of powers-of-two. Specifically, integer multiplication by a constant value can be replaced by the following formula:

$$C = \sum_{i=0}^{n} c_i * 2^i \tag{4}$$

For example, the term 42t(1) from working set W can be converted to 32t(1)+8t(1)+2t(1). Similarly, the term 170t(0) can be converted to 128t(0)+32t(0)+8t(0)+2t(0), and the term 941t(2) can be converted to 1024t(2)−64t(2)−16t(2)−2t(2)−t(2).

In addition to the power-of-two conversion shown above, the term 941t(2) can be converted into another power-of-two representation: 1024t(2)−64t(2)−16t(2)−4t(2)+t(2). These two conversions are the minimum power-of-two representations possible for this term. Specifically, these two conversions contain the minimum number of powers-of-two terms needed to convert the term 941. According to one embodiment of the invention, the conversion conducted in step S403 is limited to the minimum power-of-two representations for each term in the working set W. It is important to note that an infinite number of conversions are possible for each term simply by adding addition power-of-two terms to the representation. If minimizing the number of adders is an optimization objective of the user, only the minimum representations should be used in the process. However, alternative embodiments of the invention may include additional representations having more than the minimum number of terms required for the conversion.

In step S404, power-of-two representation sets are constructed using unique combinations of the representations converted in step S403. As described above, the term 941t(2) includes two minimum power-of-two representations. In this step of the process, a representation set is constructed for each possible combination of power-of-two representations of the terms in the working set W. In the present example, two representation sets are constructed in step S404.

Set 1:

32t(1)+8t(1)+2t(1)

128t(0)+32t(0)+8t(0)+2t(0)

1024t(2)−64t(2)−16t(2)−2t(2)−t(2)

Set 2:

32t(1)+8t(1)+2t(1)

128t(0)+32t(0)+8t(0)+2t(0)

1024t(2)−64t(2)−16t(2)−4t(2)+t(2)

Once the power-of-two representation sets have been constructed in step S404, the process concludes in step S405 and the representation sets are stored for use in the optimization process. Processing then returns to the flowchart depicted in FIG. 2.

In step S206, an optimized solution is generated for the current power-of-two representation set constructed in step S404. Step S206 is repeated for each representation set constructed. Accordingly, in step S205 it is determined if a power-of-two representation set remains to be analyzed. If one remains, processing proceeds to step S206. If no sets remain, processing returns to step S203 to determine if another candidate factor remains in the factorization set S.

Figure 5:
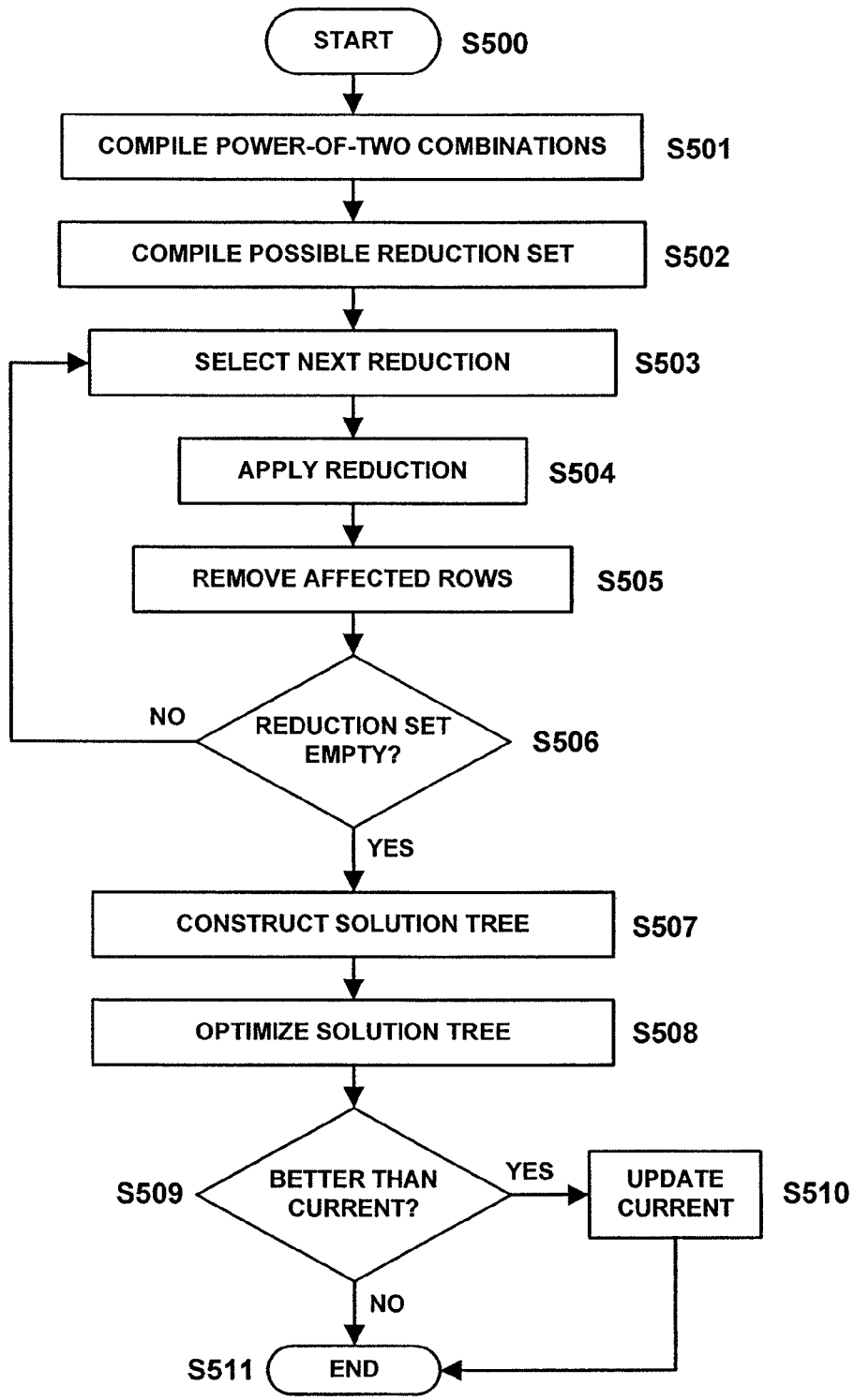
FIG. 5 is a flowchart depicting a reduction set selection process according to one embodiment of the invention.

FIG. 5 depicts a flowchart of process steps executed to generate an optimized solution as indicated in step S206. As represented in FIG. 5, the process includes compiling power-of-two combinations (step S501), compiling possible reduction sets (step S502), selecting a reduction set (step S503), applying the selected reduction set (step S504), removing affected rows from the reduction set (step S505), constructing a solution tree (step S507), optimizing the constructed solution tree (step S508), comparing the optimized solution tree to the current best solution (step S509), and updating the current solution with the optimized solution tree if it is better than the current solution (step S510). Each of these process steps will be described in additional detail below.

The process depicted in FIG. 5 begins at step S500 with the retrieval of the next power-of-two representation set to be analyzed. The set may be stored in main memory 13 of computer system 10, in storage device 15, or in other locations accessible to computer system 10. In step S501, the representation set is analyzed and a list of combinations of two or more power-of-two factors from the representation set is compiled. Specifically, the power-of-two representation of each coefficient term is analyzed and every possible combination of two or more power-of-two factors used to represent that term is compiled into a combination set. For example using Set 1 shown above, the following groupings/combinations of two terms are possible:

| | | | |
|---|---|---|---|
| +32t(1), | +8t(1) | +1024t(2), | −16t(2) |
| +32t(1), | +2t(1) | +1024t(2), | −2t(2) |
| +8t(1), | +2t(1) | +1024t(2), | −t(2) |
| +128t(0), | +32t(0) | −64t(2), | −16t(2) |

-continued

| | | | |
|---|---|---|---|
| +128t(0), | +8t(0) | −64t(2), | −2t(2) |
| +128t(0), | +2t(0) | −64t(2), | −t(2) |
| +32t(0), | +8t(0) | −16t(2), | −2t(2) |
| +32t(0), | +2t(0) | −16t(2), | −t(2) |
| +8t(0), | +2t(0) | −2t(2), | −t(2) |
| +1024t(2), | −64t(2) | | |

The following groupings/combinations of three terms are possible:

| | | |
|---|---|---|
| +32t(1), | +8t(1), | +2t(1) |
| +128t(0), | +32t(0), | +8t(0) |
| +128t(0), | +32t(0), | +2t(0) |
| +128t(0), | +8t(0), | +2t(0) |
| +32t(0), | +8t(0), | +2t(0) |
| +1024t(2), | −64t(2), | −16t(2) |
| +1024t(2), | −64t(2), | −2t(2) |
| +1024t(2), | −64t(2), | −t(2) |
| +1024t(2), | −16t(2), | −2t(2) |
| +1024t(2), | −16t(2), | −t(2) |
| +1024t(2), | −2t(2), | −t(2) |
| −64t(2), | −16t(2), | −2t(2) |
| −64t(2), | −16t(2), | −t(2) |
| −64t(2), | −2t(2), | −t(2) |
| −16t(2), | −2t(2), | −t(2) |

The following groupings/combinations of four terms are possible:

| | | | |
|---|---|---|---|
| +128t(0), | +32t(0), | +8t(0), | +2t(0) |
| +1024t(2), | −64t(2), | −16t(2), | −2t(2) |
| +1024t(2), | −64t(2), | −16t(2), | −t(2) |
| +1024t(2), | −64t(2), | −2t(2), | −t(2) |
| +1024t(2), | −16t(2), | −2t(2), | −t(2) |
| −64t(2), | −16t(2), | −2t(2), | −t(2) |

The following grouping/combination of five terms is possible:

| | | | | |
|---|---|---|---|---|
| +1024t(2), | −64t(2), | −16t(2), | −2t(2), | −t(2) |

In step S502, the list of power-of-two combination compiled in step S501 is analyzed and all combinations that are multiples of each other and which do not share a common term are identified as possible reductions and added to a reduction set R. For example, using the combination lists provide above, the reduction set R is populated with the following possible reductions:

| | | | |
|---|---|---|---|
| Reduction (3 × 2): | +128t(0), | +32t(0), | +8t(0) |
| | +32t(1), | +8t(1), | +2t(1) |
| Reduction (3 × 2): | +32t(0), | +8t(0), | +2t(0) |
| | +32t(1), | +8t(1), | +2t(1) |
| Reduction (3 × 2): | −64t(2), | −16t(2), | −t(2) |
| | +128t(0), | +32t(0), | +2t(0) |
| Reduction (2 × 2): | +128t(0), | +32t(0) | |
| | +32t(1), | +8t(1) | |
| Reduction (2 × 2): | +128t(0), | +8t(0) | |
| | +32t(1), | +2t(1) | |
| Reduction (2 × 2): | +32t(0), | +8t(0) | |
| | +32t(1), | +8t(1) | |
| Reduction (2 × 2): | −64t(2), | −t(2) | |
| | +128t(0), | +2t(0) | |

-continued

| | | |
|---|---|---|
| Reduction (2 × 3): | +32t(0), | +2t(0) |
| | +32t(1), | +2t(1) |
| | +128t(0), | +8t(0) |
| Reduction (2 × 3): | +8t(0), | +2t(0) |
| | +32t(1), | +8t(1) |
| | +128t(0), | +32t(0) |
| Reduction (2 × 4): | −64t(2), | −16t(2) |
| | +32t(1), | +8t(1) |
| | +128t(0), | +32t(0) |
| | +8t(0), | +2t(0) |
| Reduction (2 × 4): | −16t(2), | −t(2) |
| | +32t(1), | +2t(1) |
| | +128t(0), | +8t(0) |
| | +32t(0), | +2t(0) |

Accordingly, in steps S501 and S501 terms in the working set that have a common partial sum, or multiple of the partial sum, within their respective power-of-two representations are grouped together as represented with the reductions identified above.

Using the reductions representing the grouped terms, a reduction set is compiled and an order of application of the reduction set is selected. Returning to FIG. 5, in step S503 the reductions in reduction set R are compared two at a time and the best reduction based on the optimization objectives input in step S201 is selected. For example, the reduction having the greatest commonality within the power-of-two representations thereby resulting in the largest reduction in the number of adders may be selected as the best reduction according to one embodiment of the invention. In the current example, the following reduction is identified as the best reduction in reduction set R:

| | | |
|---|---|---|
| Reduction (2 × 4): | −64t(2), | −16t(2) |
| | +32t(1), | +8t(1) |
| | +128t(0), | +32t(0) |
| | +8t(0), | +2t(0) |

This reduction reduces the number of adders required to implement the FIR filter defined by filter equation (2) by 3 adders. The number of adders removed can be calculated using the following formula:

$$\text{Reduction} = (\text{rows} * \text{columns}) - (\text{rows} + \text{columns} - 1) \quad (5)$$

Using this formula, the adders removed equals (4*2)−(4+2−1)=3.

In step S504, the selected reduction set is applied to the working set W by introducing new intermediate terms to replace the corresponding power-of-two factors affected by the reduction. For example, the reduction selected above introduces the following intermediate terms:

$$n(0) = 2t(0) + 8t(1)$$

$$n(1) = 32t(0) - 16t(2)$$

$$n(2) = n(0) + n(1)$$

Applying the selected reduction to the working set W leaves the following terms in the working set W: 2t(1), 1024t(2), −2t(2), −t(2), n(2), 4n(2).

In step S505, all power-of-two factor combinations in reduction set R having at least one term in common with the selected reduction are removed from the set. Since a reduction requires at least two power-of-two combinations, all reductions in the reduction set R that no longer have at least two power-of-two combinations are removed from the reduction set R.

In step S506, it is determined if the reduction set R contains any reductions after the foregoing purge of power-of-two factor combinations. If one or more reductions remain in the reduction set R, the process returns to step S503 and steps S503 to S506 are repeated with the remaining reductions. If the reduction set R is empty, processing proceeds to step S507. In the current example, no reductions remain in the reduction set R after the initially selected reduction is applied. For cases where the reduction set R is not empty, the remaining reductions are compared two at a time in step S503 and the best reduction based on the optimization objectives is selected and added to the reduction set. Steps S504 and S505 are then repeated. This loop continues until no more reductions remain in the reduction set R. In this manner, the reduction set is complied from all possible reductions and an order of application of the reductions is selected based on the optimization objectives.

Figure 6:
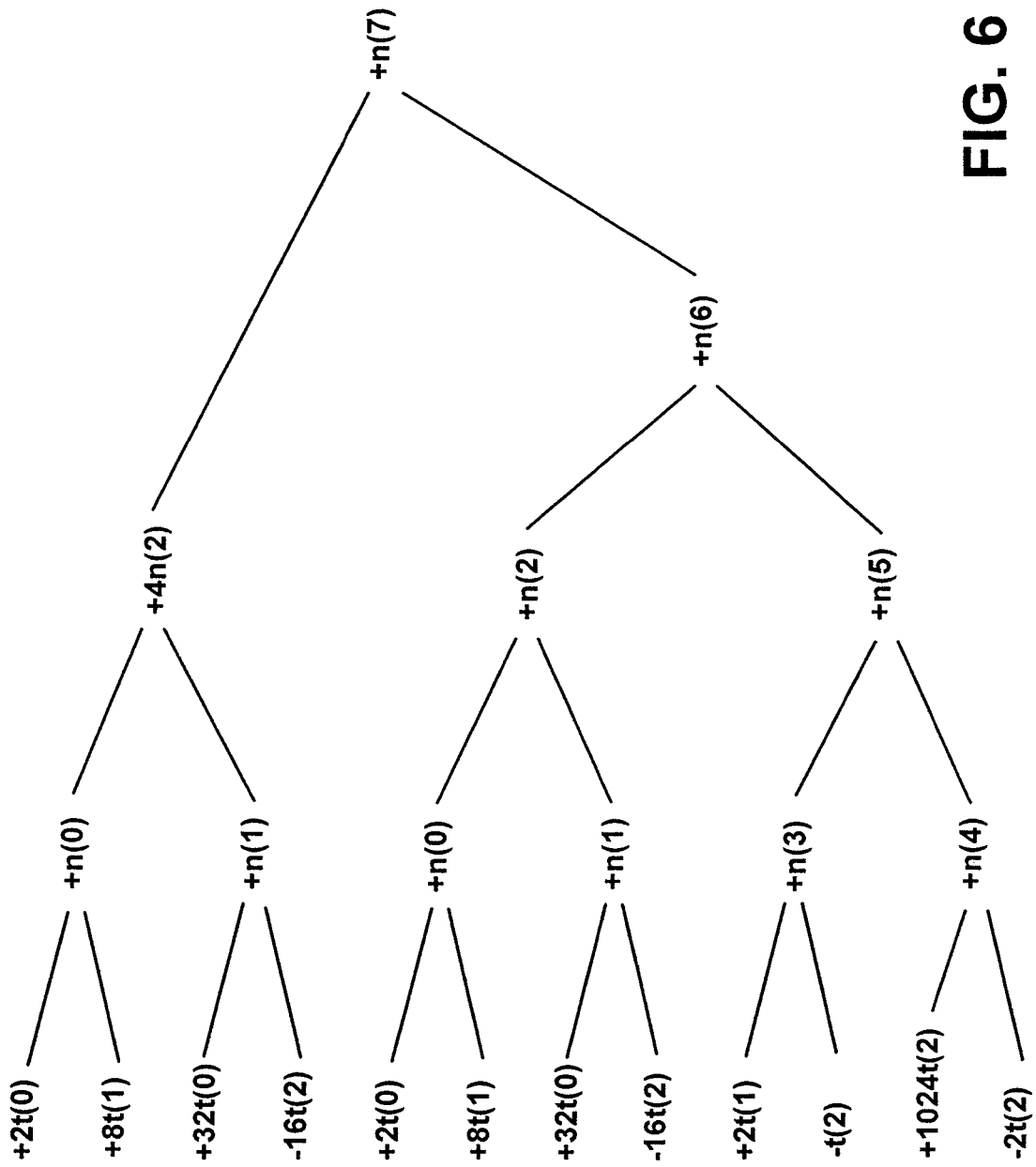
FIG. 6 is a solution tree for a FIR filter configuration according to one embodiment of the invention.
Figure 7:
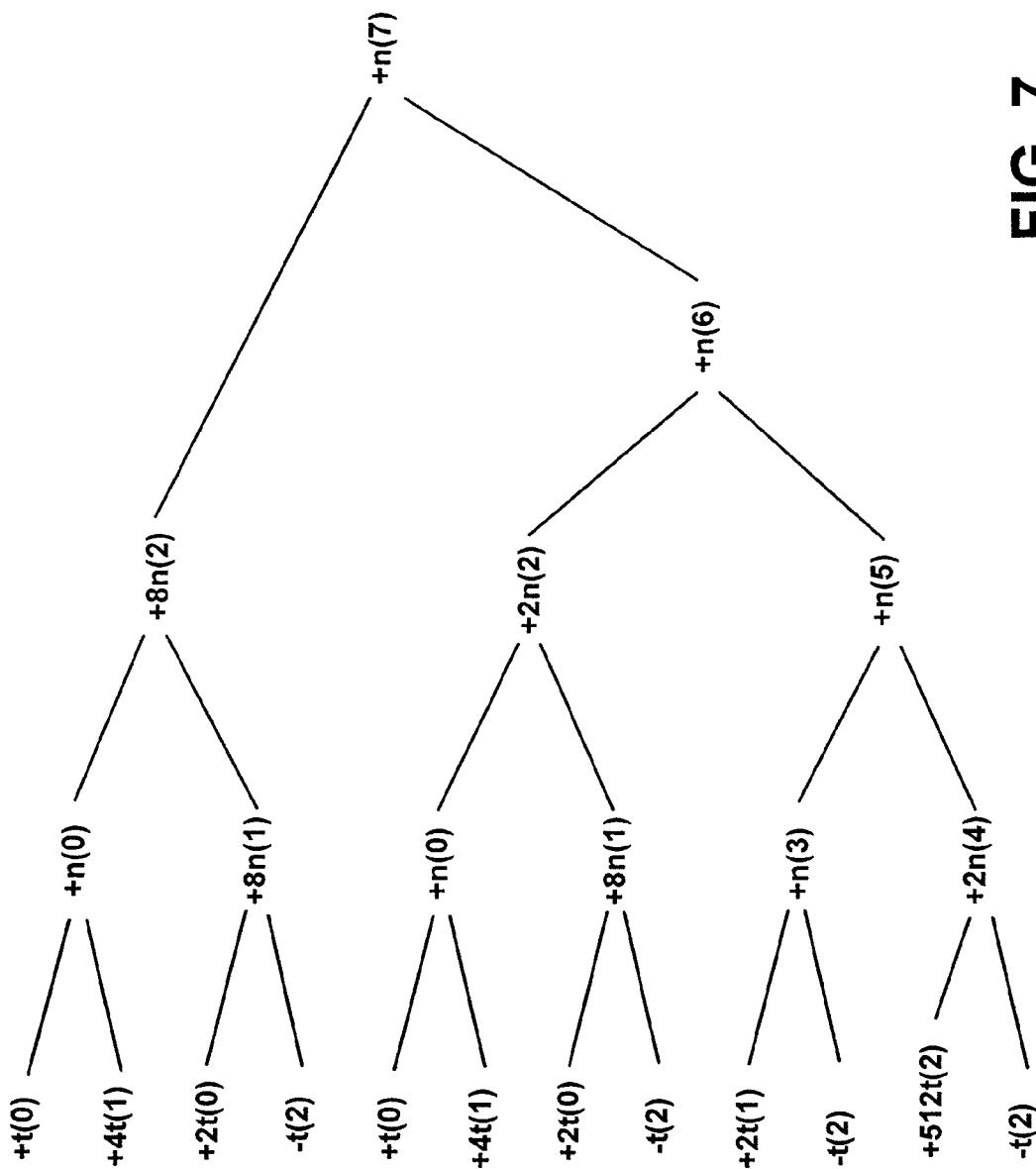
FIG. 7 is an optimized solution tree for a FIR filter configuration according to one embodiment of the invention.

In step S507, the reduction set compiled in the iterations of steps S503 to S506 is applied to the working set of terms by constructing a solution tree using the reduction set. FIG. 6 contains an illustration of the solution tree according to the present example. In step S508, the constructed solution tree is optionally optimized. Optimization of the solution tree is performed by propagating the greatest common divisor (GCD) of each pair of nodes up to the respective parent nodes. For example, for the node pair +2t(0) and +8t(1) the GCD of 2 is pushed up to parent node +n(0) creating a new node +2n(0). Similarly, the GCD of 2 for the node pair +32t(0) and −16t(2) is pushed up to parent node +n(1) creating a new node +n(1). Continuing with the propagation, the GCD of 2 now existing for the node pair +2n(0) and +2n(1) is pushed up to parent node +4n(2) creating a new node +8n(2). Each node pair is examined for possible propagations. FIG. 7 is an illustration of the solution tree in FIG. 6 after optimization has been performed in step S508.

In step S509, the optimized solution tree is compared against the current best solution stored in computer system 10 and ranked. The comparison and ranking are based on the optimization objectives input/selected by the user when initializing the optimization process. For example, the optimized solution and the current best solution can be compared based on data path width, total number of adders, logic depth of the solution tree, etc. As previously described, the optimization objectives provide user configurable selection criteria for evaluating solution sets generated by the optimization process of the invention. If the optimized solution ranks better than the current best solution, or if the optimized solution is the first solution generated, it is stored as the current best solution in step S510 and the process concludes in step S511. If the optimized solution does not rank better than the current best solution based on the optimization objectives, then the current best solution remains the same and the process concludes in step S511. Alternatively, each optimized solution generated by different iterations of the optimization process may be stored with its ranking for future use/reference by a user.

Returning to the flowchart depicted in FIG. 2, the process returns to step S205 and it is determined if another power-of-two representation set remains for analysis. If a power-of-two representation set remains, step S206 is repeated for the next power-of-two representation. If no power-of-two representation remains, processing returns to step S203 to determine if another candidate factor remains in the factorization set. If another candidate factor remains, processing returns to step S204. If no candidate factors remain, the optimization process concludes at step S207 and the current best solution is stored and/or displayed on computer system 10 for the user.

As indicated above, the described optimization process provides flexibility for a user to optimize the implementation of a digital filter in accordance with desired optimization objectives. Accordingly, different system specifications may be taken into account when determining an optimal configuration of the implementation of a digital filter using the present invention.

The foregoing description is provided to enable one skilled in the art to practice the various embodiments of the invention described herein. Various modifications to these embodiments will be readily apparent to those skilled in the art, and generic principles defined herein may be applied to other embodiments. Thus, the following claims are not intended to be limited to the embodiments of the invention shown and described herein, but are to be accorded the full scope consistent with the language of the claims. All structural and functional equivalents to the elements of the various embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for optimizing a digital filter defined by a plurality of coefficients that are multiplied by input data and accumulated to generate output data, the method comprising the steps of:
   compiling a factorization set of candidate factors based on the plurality of coefficients; and
   for each candidate factor in the factorization set:
      applying the candidate factor to the plurality of coefficients to compile a working set of terms;
      converting terms in the working set to power-of-two representations;
      grouping terms in the working set that have a common partial sum, or multiple of the partial sum, within their respective power-of-two representations;
      compiling a reduction set from the grouped terms and selecting an order of application of the reduction set based on optimization objectives;
      applying the reduction set to the working set of terms to generate an optimized solution; and
      ranking and storing the optimized solution based on the optimization objectives wherein the method is implemented by a computer, wherein the optimized solution is ranked against a current solution based on the optimization objectives, and
   wherein the optimized solution is stored in place of the current solution if the optimized solution is ranked better than the current solution.

2. The method according to claim 1, wherein said step of compiling a working set of terms comprises the steps of:
   identifying terms in the working set having a common odd fundamental; and
   combining the identified terms into intermediate terms corresponding to the odd fundamental factors.

3. The method according to claim 1, wherein the power-of-two representations are minimum power-of-two representations of the terms.

4. The method according to claim 1, wherein the converting step comprises converting terms in the working set to all possible minimum power-of-two representations,
   wherein the method further comprises a step of constructing a representation set for unique combinations of minimum power-of-two representations of the working set, and
   wherein said grouping step, said compiling a reduction set step, said applying step and said ranking step are repeated for each representation set.

5. The method according to claim 1, wherein said grouping step comprises grouping terms in the working set having the greatest commonality in their power-of-two representations.

6. The method according to claim 1, further comprising the steps of:
   constructing a solution tree based on the optimized solution;
   calculating the greatest common divisor for each pair of child nodes in the solution tree; and
   propagating the calculated greatest common divisor for each pair of child nodes to the parent node.

7. The method according to claim 1, wherein the optimization objectives include at least one of minimize adder count, minimize register count, minimize data path, minimize tree depth, minimize sum of weighted adders plus weighted registers, maximize parallelism, and maximize pipelineability.

8. A computer-readable storage medium containing computer-executable instructions for performing a method for optimizing a digital filter defined by a plurality of coefficients that are multiplied by input data and accumulated to generate output data, the method comprising the steps of:
   compiling a factorization set of candidate factors based on the plurality of coefficients; and
   for each candidate factor in the factorization set:
      applying the candidate factor to the plurality of coefficients to compile a working set of terms;
      converting terms in the working set to power-of-two representations;
      grouping terms in the working set that have a common partial sum, or multiple of the partial sum, within their respective power-of-two representations;
      compiling a reduction set from the grouped terms and selecting an order of application of the reduction set based on optimization objectives;
      applying the reduction set to the working set of terms to generate an optimized solution; and
      ranking and storing the optimized solution based on the optimization objectives, wherein the optimized solution is ranked against a current solution based on the optimization objectives, and
   wherein the optimized solution is stored in place of the current solution if the optimized solution is ranked better than the current solution.

9. The computer-readable storage medium according to claim 8, wherein said step of compiling a working set of terms comprises the steps of:
   identifying terms in the working set having a common odd fundamental; and
   combining the identified terms into intermediate terms corresponding to the odd fundamental factors.

10. The computer-readable storage medium according to claim 8, wherein the power-of-two representations are minimum power-of-two representations of the terms.

11. The computer-readable storage medium according to claim 8, wherein the converting step comprises converting terms in the working set to all possible minimum power-of-two representations, wherein the method further comprises a step of constructing a representation set for unique combinations of minimum power-of-two representations of the working set, and wherein said grouping step, said compiling a reduction set step, said applying step and said ranking step are repeated for each representation set.

12. The computer-readable storage medium according to claim 8, wherein said grouping step comprises grouping terms in the working set having the greatest commonality in their power-of-two representations.

13. The computer-readable storage medium according to claim 8, further comprising the steps of:
constructing a solution tree based on the optimized solution;
calculating the greatest common divisor for each pair of child nodes in the solution tree; and
propagating the calculated greatest common divisor for each pair of child nodes to the parent node.

14. The computer-readable storage medium according to claim 8, wherein the optimization objectives include at least one of minimize adder count, minimize register count, minimize data path, minimize tree depth, minimize sum of weighted adders plus weighted registers, maximize parallelism, and maximize pipelineability.

15. A system for optimizing a digital filter defined by a plurality of coefficients that are multiplied by input data and accumulated to generate output data, the system comprising:
a memory; and
a processor configured to execute a method comprising the steps of:
compiling a factorization set of candidate factors based on the plurality of coefficients; and
for each candidate factor in the factorization set:
applying the candidate factor to the plurality of coefficients to compile a working set of terms;
converting terms in the working set to power-of-two representations;
grouping terms in the working set that have a common partial sum, or multiple of the partial sum, within their respective power-of-two representations;
compiling a reduction set from the grouped terms and selecting an order of application of the reduction set based on optimization objectives;
applying the reduction set to the working set of terms to generate an optimized solution; and
ranking and storing the optimized solution based on the optimization objectives, wherein the optimized solution is ranked against a current solution based on the optimization objectives, and
wherein the optimized solution is stored in place of the current solution if the optimized solution is ranked better than the current solution.

16. The system according to claim 15, wherein said step of compiling a working set of terms comprises the steps of:
identifying terms in the working set having a common odd fundamental; and
combining the identified terms into intermediate terms corresponding to the odd fundamental factors.

17. The system according to claim 15, wherein the power-of-two representations are minimum power-of-two representations of the terms.

18. The system according to claim 15, wherein the converting step comprises converting terms in the working set to all possible minimum power-of-two representations,
wherein the method further comprises a step of constructing a representation set for unique combinations of minimum power-of-two representations of the working set, and
wherein said grouping step, said compiling a reduction set step, said applying step and said ranking step are repeated for each representation set.

19. The system according to claim 15, wherein said grouping step comprises grouping terms in the working set having the greatest commonality in their power-of-two representations.

20. The system according to claim 15, further comprising the steps of:
constructing a solution tree based on the optimized solution;
calculating the greatest common divisor for each pair of child nodes in the solution tree; and
propagating the calculated greatest common divisor for each pair of child nodes to the parent node.

21. The system according to claim 15, wherein the optimization objectives include at least one of minimize adder count, minimize register count, minimize data path, minimize tree depth, minimize sum of weighted adders plus weighted registers, maximize parallelism, and maximize pipelineability.

* * * * *